(12) United States Patent
Feng et al.

(10) Patent No.: US 11,829,696 B2
(45) Date of Patent: Nov. 28, 2023

(54) CONNECTION ANALYSIS METHOD FOR MULTI-PORT NESTING MODEL AND STORAGE MEDIUM

(71) Applicant: INSPUR SUZHOU INTELLIGENT TECHNOLOGY CO., LTD., Jiangsu (CN)

(72) Inventors: Peng Feng, Jiangsu (CN); Xinwu Shen, Jiangsu (CN); Ruizhen Wu, Jiangsu (CN); Fang Wang, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 4 days.

(21) Appl. No.: 18/022,122

(22) PCT Filed: Sep. 30, 2021

(86) PCT No.: PCT/CN2021/122284
§ 371 (c)(1),
(2) Date: Feb. 17, 2023

(87) PCT Pub. No.: WO2022/049517
PCT Pub. Date: Mar. 10, 2022

(65) Prior Publication Data
US 2023/0229838 A1 Jul. 20, 2023

(30) Foreign Application Priority Data

Nov. 19, 2020 (CN) .......................... 202011313369.X (51) Int. Cl.
*G06F 30/347* (2020.01)
(52) U.S. Cl.
CPC .................. *G06F 30/347* (2020.01)
(58) Field of Classification Search
CPC ...................................................... G06F 30/347
(Continued)

(56) References Cited

U.S. PATENT DOCUMENTS

| 8,977,995 B1 * | 3/2015 | Arora ..................... G06F 30/327 716/108 |
| 10,997,333 B1 * | 5/2021 | Singh ..................... G06F 30/392 |
| 2008/0222591 A1 * | 9/2008 | Furukawa ............... G06F 30/30 716/126 |

FOREIGN PATENT DOCUMENTS

| CN | 101329703 A | 12/2008 |
| CN | 105335205 A | 2/2016 |

(Continued)

OTHER PUBLICATIONS

PCT/CN2021/122284 international search report.
CN 202011313369.X first office action.

*Primary Examiner* — Suchin Parihar
(74) *Attorney, Agent, or Firm* — IPRO, PLLC (57) ABSTRACT

A connection analysis method for a multi-port nested model and a medium. The method includes: acquiring instance information and nested relationships of a multi-port nested model, and building an instance relationship tree; reading port information and connection information of instances, and adding the port information and the connection information to the instance relationship tree; acquiring the port information and the connection information of the instances of each node layer by layer according to the instance relationship tree to build a connection dictionary; and acquiring port-to-port connection information of the instances by retrieving the connection dictionary to perform connection analysis on the multi-port nested model.

20 Claims, 9 Drawing Sheets

(58) Field of Classification Search
USPC .......................................................... 716/121
See application file for complete search history.

(56) References Cited

FOREIGN PATENT DOCUMENTS

| | | |
|---|---|---|
| CN | 108509725 A | 9/2018 |
| CN | 110489812 A | 11/2019 |
| CN | 110750245 A | 2/2020 |
| CN | 110781082 A | 2/2020 |
| CN | 112182998 A | 1/2021 |
| CN | 112464591 A | 3/2021 |

* cited by examiner

| Source ports | Target ports |
|---|---|
| A.P0 | B.P0 |
| A.P0 | C.P0 |
| A.P1 | B.P1 |
| B.P2 | A.P2 |
| B.P1 | D.P0 |
| C.P0 | E.P0 |
| E.P1 | C.P1 |
| C.P2 | E.P0 |
| C.P2 | F.P2 |
| D.P1 | E.P1 |
| F.P1 | B.P2 |
| F.P2 | G.P0 |
| F.P2 | H.P0 |
| G.P1 | F.P1 |

| Keywords | Connection description |
|---|---|
| A | IAPP1:IBPP1, IBPP1:IBPP0; IAPP0:ICPP0, ICPP0:IFPP0; IAPP0:IBPP0; |
| B | |
| C | ICPP2:IEPP0; ICPP2:IFPP2; (ICPP0, IEPP0); |
| D | IDPP1:IEPP1, IEPP1:ICPP1; |
| E | |
| F | |
| G | ICPP1:IFPP1, IFPP1:IBPP2, IBPP2:IAPP2; |
| H | |

CONNECTION ANALYSIS METHOD FOR MULTI-PORT NESTING MODEL AND STORAGE MEDIUM

CROSS REFERENCE TO THE RELATED APPLICATIONS

This application claims the priority of the Chinese patent application filed on Nov. 19, 2020 before the CNIPA, China National Intellectual Property Administration with the application number of 202011313369.X and the title of "CONNECTION ANALYSIS METHOD FOR MULTI-PORT NESTING MODEL AND STORAGE MEDIUM", which is incorporated herein in its entirety by reference.

FIELD

The present disclosure relates to the field of the design of an application specific integrated circuit system and more particularly, to a connection analysis method for a multi-port nested model and a storage medium.

BACKGROUND

In the design of the application specific integrated circuit system, the module is usually described by the hardware description language (Verilog) and the Ultra high speed integrated circuit hardware description Language (VHDL), and then the instance is generated by the instantiation module of the module. In order to form a unified and convenient port, it needs to add a layer of wrapper on the modules and the combination of modules, or add another layer of wrapper on one layer of wrapper.

An application specific integrated circuit is usually the combination and nesting of wrappers and instances. The final application specific integrated circuit design is formed by connecting the port of the instance with the port of the instance, the port of the instance with the port of the wrapper, and the port of the wrapper with the port of the wrapper by using signal lines according to the needs of chip functions.

Intellectual Property (IP) core is "a pre-designed circuit function module used in integrated circuit chips". The IP core designs some common but complex function blocks in digital circuits, such as the FIR filter, the SDRAM controller, the PCI interface, etc. into modules that may modify parameters. With the increasing scale of the chips, the design becomes more and more complex, which increases the burden of designers. By using IP core, it may avoid repetitive work, greatly reduce the burden of engineers, and greatly shorten the time to market of products.

During the design of the application specific integrated circuit system, the IP core and self-designed modules are combined to form a multi-port nested model. According to the end-to-end connection relationship of the IP core or the module in the multi-port nested model, the connection and nesting is conducted to form the functional integration to build the application specific integrated circuit system. Generally, one application specific integrated circuit system is composed of a large number of multi-port nested models, one multi-port nested model consists of a large number of instances. In the current situation, when analyzing the multi-port nested model or the application specific integrated circuit system, we need to analyze the connection relationship layer by layer according to the level of the instances, which is not only time-consuming, but also very easy to make mistakes; the analysis of the application specific integrated circuit system brings great difficulties.

SUMMARY

According to some embodiments of the present disclosure, a connection analysis method for a multi-port nested model is provided, including:
acquiring instance information and nested relationships of a multi-port nested model of an application specific integrated circuit and building an instance relationship tree;
reading port information and connection information of instances, and adding the port information and the connection information to the instance relationship tree;
acquiring the port information and the connection information of the instances of each node layer by layer according to the instance relationship tree to build a connection dictionary; and
acquiring port-to-port connection information of the instances by retrieving the connection dictionary to perform connection analysis on the multi-port nested model.

In some embodiments of the present disclosure, the acquiring instance information and nested relationships of a multi-port nested model and building an instance relationship tree includes:
recording the instance information of the multi-port nested model and the nested relationships among the instances in a YAML file;
adding root instances of the multi-port nested model in the YAML file to an instance queue to be processed;
extracting instances in the instance queue to be processed by level as corresponding level nodes of the instance relationship tree;
determining whether an extracted instance is nested with another instance; and
in response to determining that the extracted instance is nested with another instance, adding a nested instance to a next level of the instance queue to be processed, and extracting level by level to build the instance relationship tree until the instance queue to be processed is empty.

In some embodiments of the present disclosure, the reading port information and connection information of instances, and adding the port information and the connection information to the instance relationship tree includes:
reading the port information of the instances to acquire ports of the instances, and adding the ports to the instances of the instance relationship tree;
dividing ports in the port information into source ports and target ports, and acquiring a mapping relationship between the source ports and the target ports, to acquire the connection information; and
connecting ports in the instance relationship tree according to the connection information.

In some embodiments of the present disclosure, when taking one port as a reference, the connection information is divided into two categories: a second connection from the one port to another port, and a first connection from another port to the one port.

In some embodiments of the present disclosure, the connection dictionary includes keywords and connection descriptions corresponding to the keywords, the keywords are instance names of all instances in the instance relationship tree, the connection descriptions include the instances and the port information of the instances.

In some embodiments of the present disclosure, acquiring the port information and the connection information of the instances of each node layer by layer according to the instance relationship tree to build a connection dictionary includes:

traversing the instance names of all instances as the keywords;

traversing the instances of nodes of the instance relationship tree layer by layer, and determining whether the first connection and the second connection exist on ports of the instances;

in response to determining that only the second connection exist on one of the ports, tracing the instance and the port information of the instance along the second connection until arrived at one port without the second connection, recording traced contents in sequence to form the connection descriptions, and corresponding formed connection descriptions to the keywords formed by the instance names; and in response to determining that the second connection and the first connection exist on one of the ports, tracing the instance and the port information of the instance along the first connection until arrived at one port without the first connection, tracing the instance and the port information of the instance along the second connection until arrived at the port without the second connection, recording the traced contents as the connection descriptions, and the connection descriptions correspond to the keywords formed by the instance names of the instances where the port without the first connection is located.

In some embodiments of the present disclosure, the traversing the instances of nodes of the instance relationship tree layer by layer includes:

building a node queue, adding all instances of the nodes in the lowest layer of the instance relationship tree to the node queue;

determining whether the node queue is empty;

in response to the node queue being not empty, taking each instance of the node queue in sequence to process; and in response to the node queue being empty, moving up one layer, adding all instances in the layer to the node queue until all instances of the nodes in the top-most layer are processed.

In some embodiments of the present disclosure, distinguishing symbols are set between different connection descriptions corresponding to a same keyword in the connection dictionary.

In some embodiments of the present disclosure, the keyword is regarded as a search term to retrieve in the connection dictionary and acquire the port-to-port connection information of the instances.

In some other embodiments of the present disclosure, a computer-readable storage medium is provided, and at least one computer-readable instruction is stored thereon, when the at least one computer-readable instruction is executed by at least one processor, the processor is caused to execute operations of the method described above.

BRIEF DESCRIPTION OF THE DRAWINGS

To illustrate the embodiments of the present disclosure or the technical solutions in the related art more clearly, a brief description will be given below of the drawings necessary for describing the embodiments or the related art. Apparently, the drawings in the following description are only some embodiments of the present disclosure, and those of ordinary skill in the art may obtain other drawings based on these drawings without involving any inventive effort.

The realization of the aims, functional features and advantages of the present disclosure will be further described with reference to the drawings in combination with the embodiments.

DETAILED DESCRIPTION

It should be understood that the specific embodiments described herein are only used to explain the present disclosure and are not used to limit the present disclosure.

Figure 1:
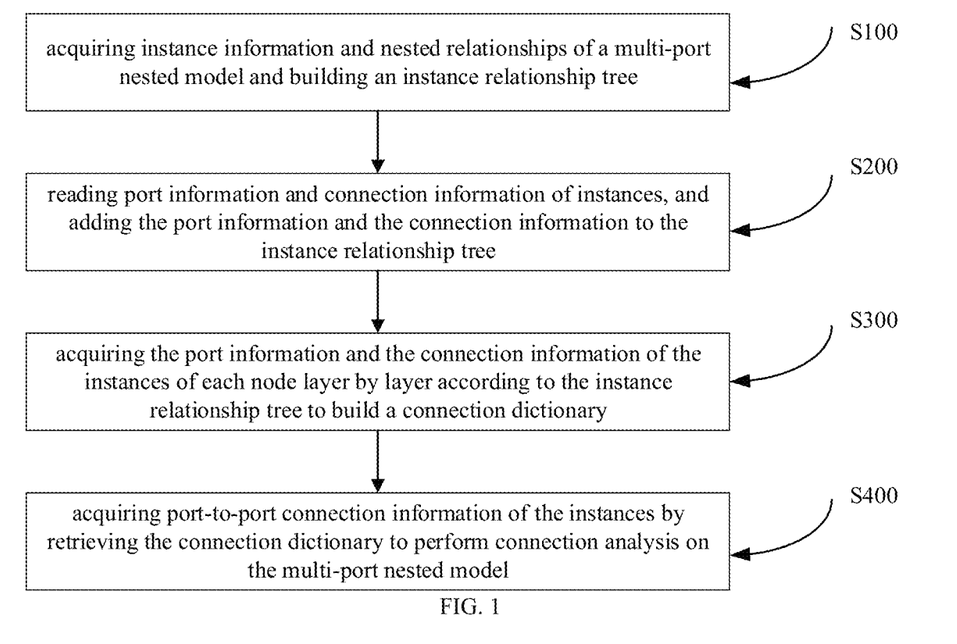
FIG. 1 is a flow chart of a connection analysis method for a multi-port nested model according to some embodiments of the present disclosure.
Figure 2:
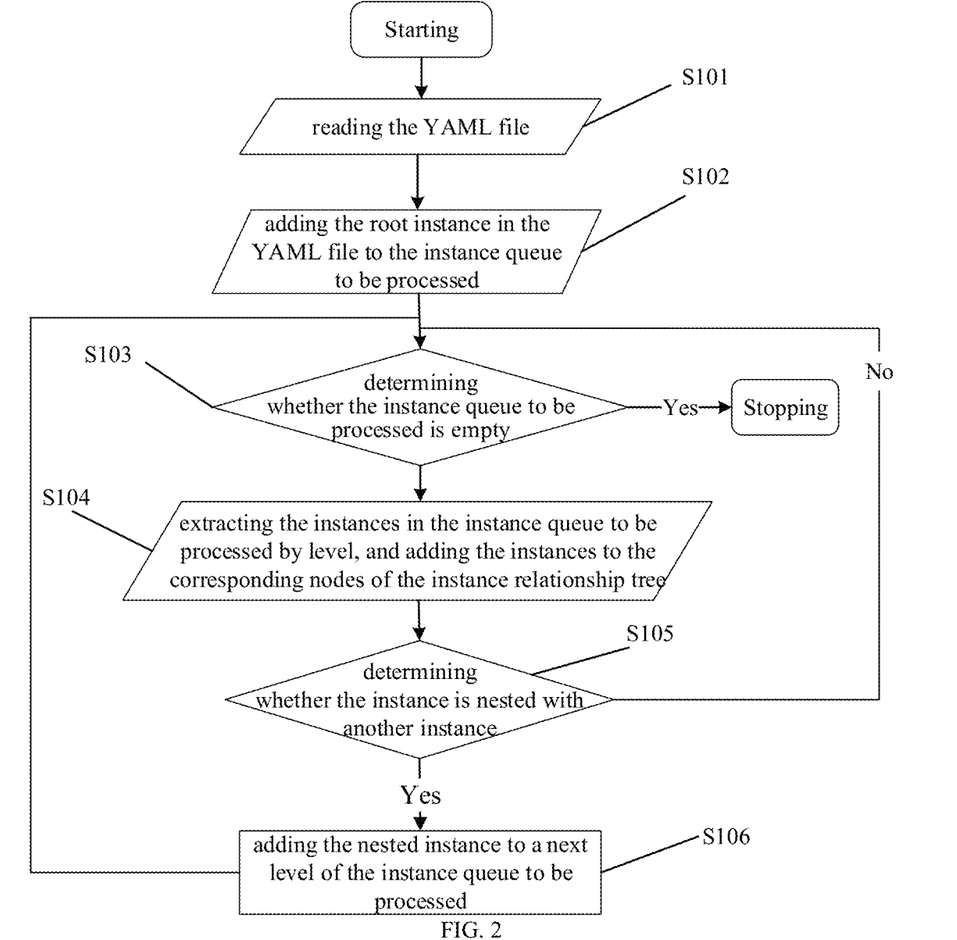
FIG. 2 is a flow chart of building an instance relationship tree according to some embodiments of the present disclosure.
Figure 3:
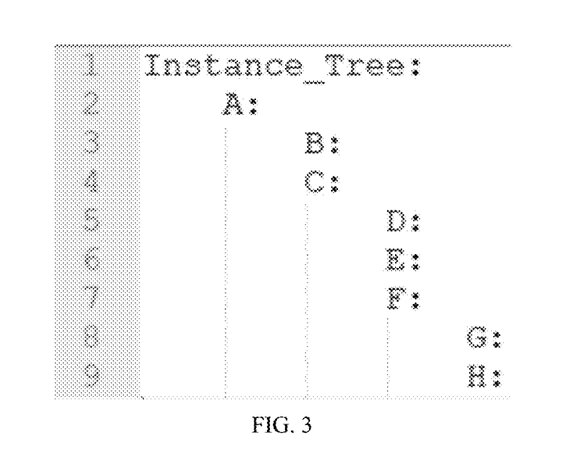
FIG. 3 is a schematic diagram of instances and nested relationships recorded in a YAML file according to some embodiments of the present disclosure.
Figure 4:
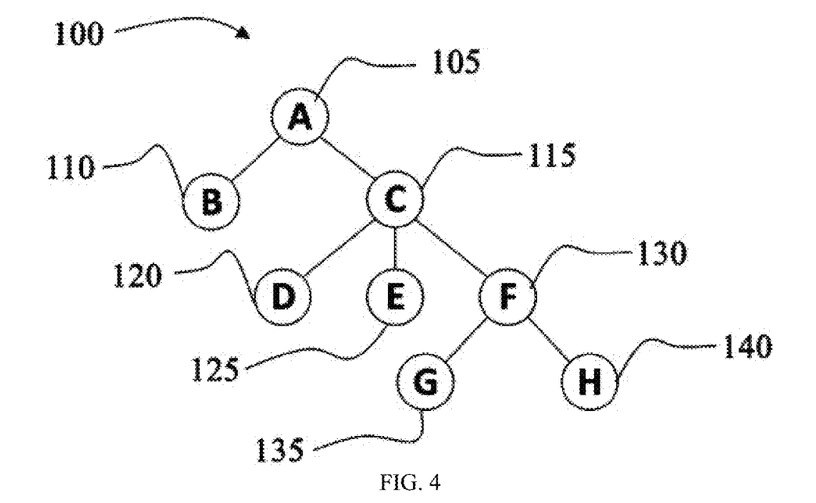
FIG. 4 is a schematic diagram of the instance relationship tree according to some embodiments of the present disclosure.
Figure 5:
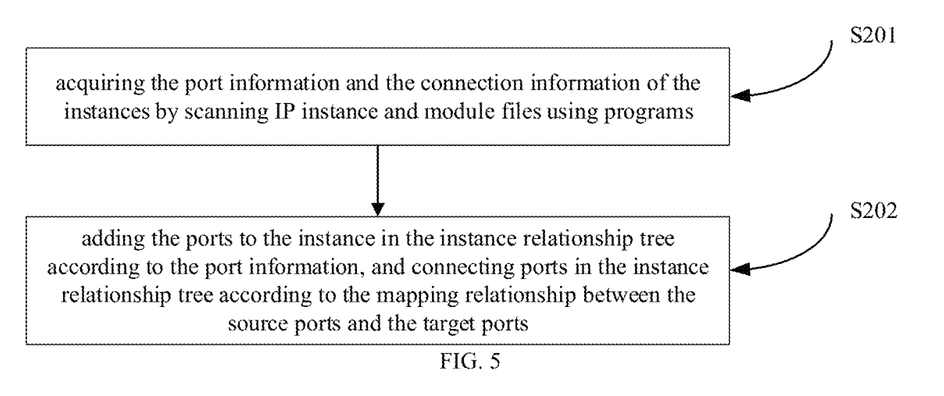
FIG. 5 is a flow chart of adding the port information and the connection information to the instance relationship tree according to some embodiments of the present disclosure.
Figure 6:
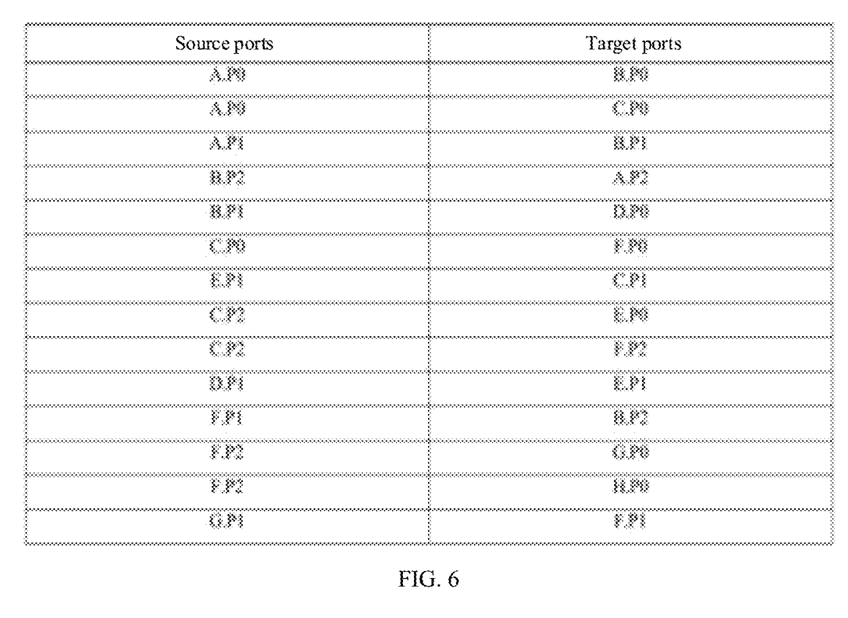
FIG. 6 is a schematic diagram of a mapping relationship data table of source ports and target ports according to some embodiments of the present disclosure.
Figure 7:
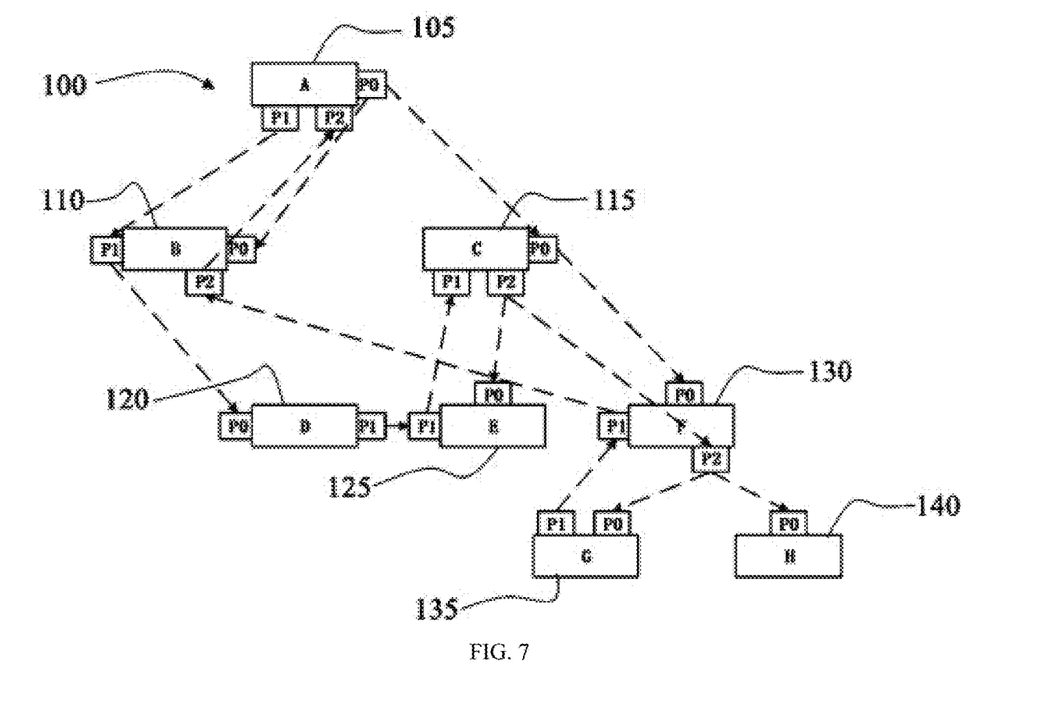
FIG. 7 is a schematic diagram of the instance relationship tree added the port information and the connection information according to some embodiments of the present disclosure.
Figure 8:
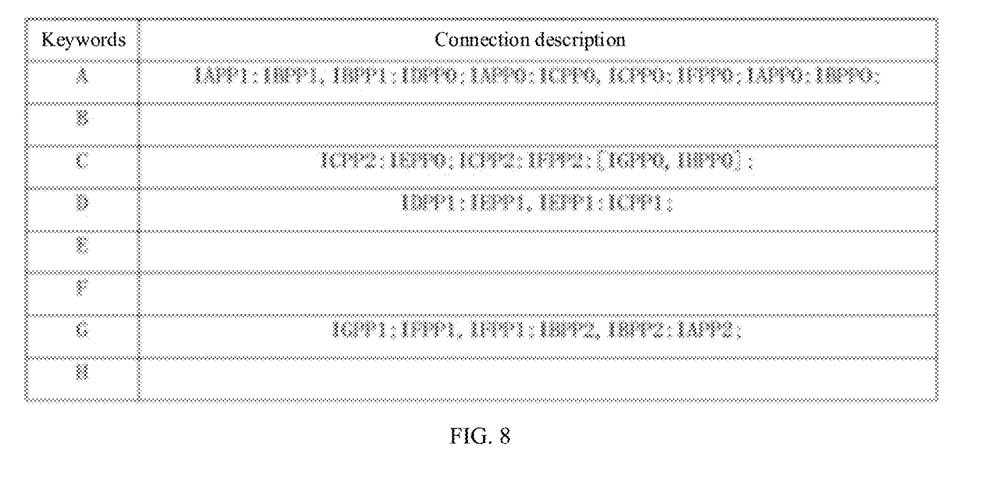
FIG. 8 is a schematic diagram of a connection dictionary according to some embodiments of the present disclosure.
Figure 9:
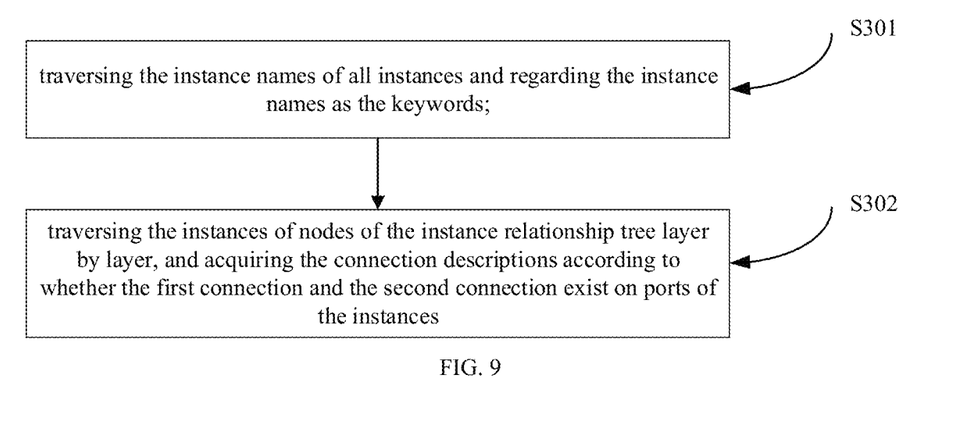
FIG. 9 is a flow chart of building the connection dictionary according to some embodiments of the present disclosure.
Figure 10:
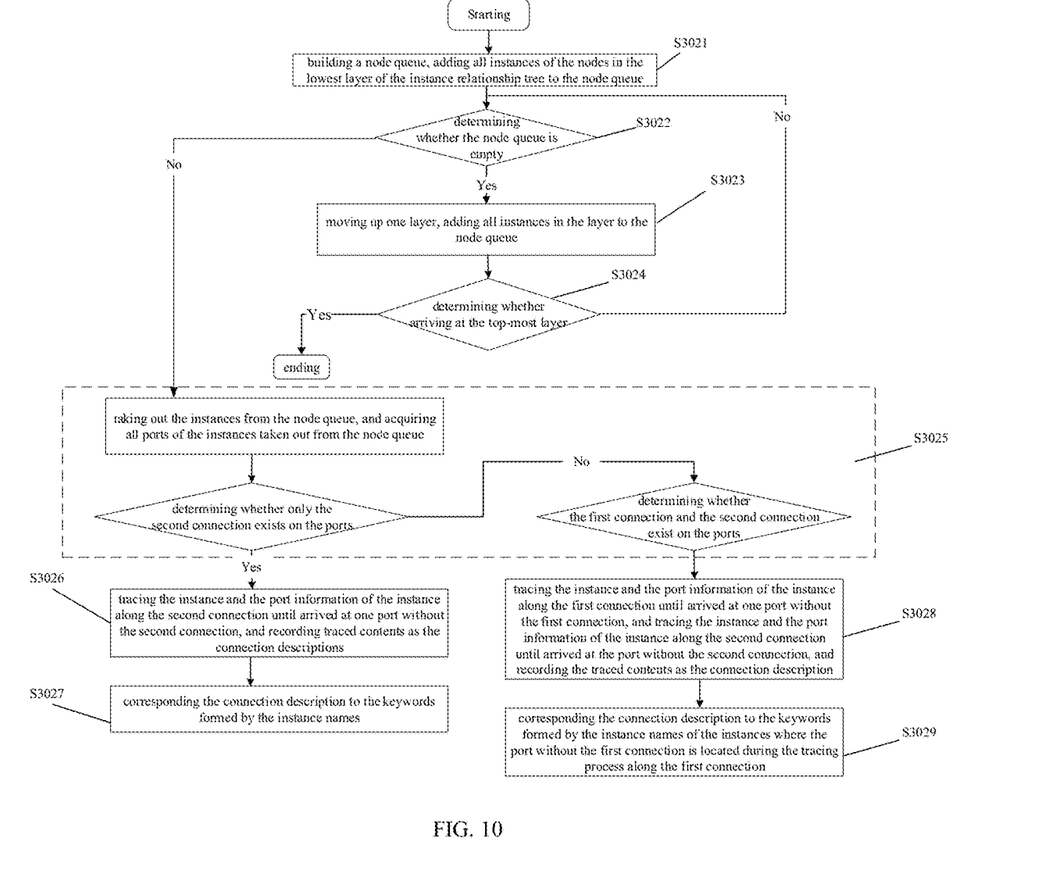
FIG. 10 is a flow chart of acquiring connection descriptions from the instance relationship tree according to some embodiments of the present disclosure.

The present disclosure will be described in combination with the drawings, in which, FIG. 1 is a flow chart of a connection analysis method for a multi-port nested model according to some embodiments of the present disclosure; FIG. 2 is a flow chart of building an instance relationship tree according to some embodiments of the present disclosure; FIG. 3 is a schematic diagram of instances and nested relationships recorded in YAML file according to some embodiments of the present disclosure; FIG. 4 is a schematic diagram of the instance relationship tree according to some embodiments of the present disclosure; FIG. 5 is a flow chart of adding the port information and the connection information to the instance relationship tree according to some embodiments of the present disclosure; FIG. 6 is a schematic diagram of a mapping relationship data table of source ports and target ports according to some embodiments of the present disclosure; FIG. 7 is a schematic diagram of the instance relationship tree added the port information and the connection information according to some embodiments of the present disclosure; FIG. 8 is a schematic diagram of a connection dictionary according to some embodiments of the present disclosure; FIG. 9 is a flow chart of building the connection dictionary according to some embodiments of the present disclosure; and FIG. 10 is a flow chart of acquiring connection descriptions from the instance relationship tree according to some embodiments of the present disclosure.

As used herein, the term "module" refers to the hardware description language program that may complete specific circuit functions in the chip design. The module may be used as a template to generate a plurality of hardware description language program instances that may complete specific circuit functions.

As used herein, the term "IP" may include a module or a combination of a plurality of modules. The module may have a plurality of ports.

As used herein, the term "port" refers to the circuit interface of hardware that may complete specific circuit functions, which may be input, output, or bidirectional.

As used herein, the term "instance" refers to the hardware description language program of the specific circuit function obtained from the instantiation of the module and IP, as the specific implementation of the module, its port is consistent with the corresponding module and IP.

As used herein, the term "instantiation" refers to the operation of generating hardware description language program instances of specific circuit functions using modules as templates.

As used herein, the term "wrapper" refers to the circuit structure that converts the original instance port or the original wrapper port. The purpose is to make the original instance or the original wrapper present a port with a unified style. The wrapper contains a plurality of instances and wrappers.

As used herein, the term "nested model" refers to a kind of structural equation models. Where, when all parameters of model A are part of parameters with the same type in model B, model A is said to be nested in model B. In a path map, the path map of model A may be obtained by removing part of the path from the path map of model B, which is said that model A is nested in model B.

As used herein, the term "nested relationship" refers to the hierarchy and inclusion relationship of each wrapper and instance in the chip design. For example, wrapper A contains instance B, and instance C is juxtaposed with instance D. This relationship may be identified by the data structure of a computer language, which is described in YAML format in the specification.

As used herein, the term "YAML" is a format used to express data serialization. It may simply express data forms such as lists, hash tables, and scalars, it is a data structure suitable for expressing hierarchical models.

As used herein, the term "dictionary" refers to the dictionary data type in the computer programming language Python.

The present disclosure aims to provide an improved application specific integrated circuit design method, in which the hierarchy and inclusion relationship of the wrapper and instance in the application specific integrated circuit design, and the connection relationships among various ports are abstracted into a formal data structure representation and saved as one or more text files. Through the retrieval of this text file by computer program, the port-to-port connection relationship between different instance ports is obtained. In the retrieval, in order to obtain the port-to-port connection relationship, these hierarchies need to be searched and expanded. Because the port may be input, output or bidirectional, it is difficult to obtain accurate port connection relationship in a single search, and repeated searches is very time-consuming. The present disclosure realizes the process of creating accurate port-to-port connection relationship in a single search under a single tree structure by combining search and dictionary mapping.

The present disclosure instantiates the IP core and the module involved in the multi-port nested model to form an instance. The instance includes the definition of the IP core and the module, the definition of all ports of the IP core and the module, and the definition of the connection of the IP core and the module ports.

Some embodiments of the connection analysis method for the multi-port nested model according to the present disclosure are described below with reference to the drawings.

Referring to FIG. 1, the present disclosure provides a connection analysis method for a multi-port nested model, including operations:

S100, acquiring instance information and nested relationships of a multi-port nested model and building an instance relationship tree. In some embodiments, referring to FIG. 3, the instance information of the multi-port nested model and the nested relationships among the various instances are recorded in a YAML file; in FIG. 3, A, B, C, D, E, F, G and H represent different instances, respectively, where instance A is a root instance, the instance A is nested with an instance B and an instance C, the instance C is nested with an instance D, an instance E and an instance F, and the instance F is nested with an instance G and an instance H. An instance queue to be processed that traverses the instances in the YAML file is built. Referring to FIG. 2, building the instance relationship tree through the instance queue to be processed includes: S101, reading the YAML file; S102, adding the root instance A of the multi-port nested model in the YAML file to the instance queue to be processed; S103, determining whether the instance queue to be processed is empty, S104, extracting the instances in the instance queue to be processed by level, and regarding the instances as the corresponding level nodes of the instance relationship tree. In some embodiments, root instance A is first regarded as a root node of the instance relationship tree. S105, determining whether the instance is nested with another instance, in response to determining that the instance is nested with another instance, executing S106 to add the nested instance to a next level of the instance queue to be processed, and then executing S103; in response to determining that the instance is not nested with another instance, skipping S106 and executing S103 directly. Thus, the instances are extracted level by level to build the instance relationship tree until the instance queue to be processed is empty, and it is ended. For the instance A, it is determined that the instance A is nested with the instance B and the instance C, so the instance B and the instance C are added to the instance queue to be processed, the instance queue to be processed is not empty, and S103, S104 and S105 are executed in a circular way. The instance B is taken out and regarded as a node at a lower level of the root instance A in the instance relationship tree, the instance B is not nested with another instance, the instance queue to be processed is not empty, and S103, S104 and S105 are executed in a circular way. The instance C is taken out and regarded as a node at a lower level of the root instance A in the instance relationship tree, the instance nested in the instance C is added to the instance queue to be processed. It is executed in sequence until the instance G and the instance H are added to the instance relationship tree. Since the instance G and the instance H are not nested with another instance, the instance queue to be processed is empty, and the cycle is terminated.

Referring to FIG. 4, FIG. 4 shows the instance relationship tree 100 built by performing the above operations according to the instance information and the nested relationships of the instances in FIG. 3. Among them, FIG. 4 shows the root instance A 105, the instance B 110 and the instance C 115 nested in the instance A 105, the instance D 120, the instance E 125 and the instance F 130 nested in the instance C 115, and the instance G 135 and the instance H 140 nested in the instance F 130.

S200, reading port information and connection information of instances, and adding the port information and the connection information to the instance relationship tree. In some embodiments, referring to FIG. 5, the reading port information and connection information of instances and adding the port information and the connection information to the instance relationship tree includes: S201, acquiring the port information and the connection information of the instances by scanning IP instance files using programs. Referring to FIG. 6, an element A.P0 in the table shown in FIG. 6 is explained as follows: A is the instance A, "." is the separator, and P0 is the port. Dividing ports in the port information into source ports and target ports, and acquiring a mapping relationship between the source ports and the target ports, to acquire the connection information; S202, adding the ports to the instance in the instance relationship tree according to the port information, and connecting ports in the instance relationship tree according to the mapping relationship between the source ports and the target ports. Referring to FIG. 7, FIG. 7 is the instance relationship tree 100 obtained after adding the port information and the connection information to the instance relationship tree by executing S201-S202.

Among them, the connection information is divided into two categories, the classification standard is: taking one port as a reference, connection from the one port to another port is classified as a second connection, and connection from another port to the one port is classified as a first connection.

S300, acquiring the port information and the connection information of the instances of each node layer by layer according to the instance relationship tree to build a connection dictionary. In some embodiments, referring to FIG. 8, the connection dictionary includes keywords and connection descriptions corresponding to the keywords, the keywords are instance names of all instances in the nodes of the instance relationship tree, and the connection descriptions include the instances and the port information of the instances.

Referring to FIG. 9, the acquiring the port information and the connection information of the instances of each node layer by layer according to the instance relationship tree to build a connection dictionary includes: S301, traversing the instance names of all instances, and regarding the instance names as the keywords. In some embodiments, the instance names are traversed by using the YAML file.

S302, traversing the instances of nodes of the instance relationship tree layer by layer, and acquiring the connection descriptions according to whether the first connection and the second connection exist on ports of the instances.

In some embodiments, referring to FIG. 10, traversing the instances of nodes of the instance relationship tree layer by layer includes: S3021, building a node queue, adding all instances of the nodes in the lowest layer of the instance relationship tree to the node queue, in some embodiments, the instance G 135 and the instance H 140 in the lowest layer shown in FIG. 4 are added to the node queue; S3022, determining whether the node queue is empty, in response to the node queue being not empty, executing S3025; taking out the instance G 135 and the instance H 140 in sequence, determining whether the first connection and the second connection exist, thereinto, the node queue is empty after taking out the instance G 135 and the instance H 140; in response to the node queue being empty, S3023, moving up one layer, adding all instances in the layer to the node queue, S3024, determining whether arriving at the top-most layer of the instance relationship tree, in response to arriving at the top-most layer, ending; in response to not arriving at the top-most layer, executing S3022. In some embodiments, after the instance G 135 and the instance H 140 are processed, it moves up one layer, the layer is traversed to acquire the instance D 120, the instance E 125 and the instance F 130, then the instance D 120, the instance E 125 and the instance F 130 are added to the node queue, and S3022 and S3024 are executed in a circular way until all instances of the nodes in the top-most layer are processed. In some embodiments, the node queue is empty after the instance D 120, the instance E 125 and the instance F 130 are processed, it moves up one layer again to acquire the instance B 110 and the instance C 115, then the instance B 110 and the instance C 115 are added to the node queue, and the node queue is empty after the instance B 110 and the instance C 115 are processed. Then it moves up one layer again to acquire the instance A 105, the instance A 105 is added to the node queue, and the node queue is empty after the instance A 105 is processed. Finally, it moves up one layer again and nothing is obtained, the node queue is empty, and the circle of S3023 and S3024 is ended.

The connection description is acquired according to determining whether the first connection and the second connection exist on the ports of the instances;

S3025, acquiring all ports of the instances taken out from the node queue, and determining whether the first connection and the second connection exist on the ports, in response to determining that only the second connection exist on one of the ports (that is, the port is only connected to other ports, while other ports are not connected to the port, which illustrates that the port is an external port of the multi-port nested model), and executing S3026 tracing the instance and the port information of the instance along the second connection until arrived at one port without the second connection. In some embodiments, referring to FIG. 7, a P1 port of the instance G 135 only has the second connection to the P1 port of the instance F 130, then trace back to the P1 port of the instance F 130, while the P1 port of the instance F 130 has the second connection to a P2 port of the instance B 110, then continue to trace back to the P2 port of the instance B 110, the P2 port of the instance B 110 has the second connection to the P2 port of the instance A 105, and the P2 port of the instance A 105 has no second connection, so the tracing is over. The traced contents (the P1 port of the instance G 135, the P1 port of the instance F 130, the P2 port of the instance B 110, and the P2 port of the instance A 105) is recorded as the connection description. In some embodiments, it is described as "IGPP1: IFPP1, IFPP1: IBPP2, IBPP2: IAPP2;" where "," is the separator between the connections and ";" is the distinguishing symbol indicating the end of the connection description, "I (for the instance) G (the instance name) P (for the port) P1 (the port information): (for the connection) IFPP1"; S3027, corresponding the connection description to the keywords formed by the instance names; in some embodiments, the connection description starting from the P1 port of the instance G 135 corresponds to the keyword G.

In response to determining that the second connection and the first connection exist on one of the ports, executing S3028, tracing the instance and the port information of the instance along the first connection until arrived at one port without the first connection, and tracing the instance and the port information of the instance along the second connection until arrived at the port without the second connection. In some embodiments, referring to FIG. 7, when processing the instance E 125, the P1 port of the instance E 125 has the second connection and the first connection, and it is traced to the P1 port of the instance D 120 along the first connection, the P1 port of the instance D 120 does not have the first connection, stop tracing along the first connection, and trace to the P1 port of the instance C 115 along the second connection, the P1 port of the instance C 115 does not have second connection, and end tracing along the second connection. The traced contents are recorded as the connection description, "IDPP1: IEPP1, IEPP1: ICPP1;", S3029, corresponding the connection description to the keywords formed by the instance names of the instances where the port without the first connection is located during the tracing process along the first connection. That is, it corresponds to the keyword D.

S400, acquiring port-to-port connection information of the instances by retrieving the connection dictionary to perform connection analysis on the multi-port nested model. In some embodiments, the keyword is regarded as a search term to retrieve the search term in the connection dictionary and acquire the port-to-port connection information of the instances. Referring to FIG. 7, when the keyword C is taken as the search term and C is retrieved in the connection dictionary, the following two groups of connection descriptions may be retrieved: "ICPP2: IEPP0; ICPP2: IFPP2: [IGPP0, IHPP0];", where "IFPP2: [IGPP0, IHPP0]" means that the P2 port of the instance F 130 is connected to the P0 port of the instance G 135 and the P0 port of the instance H 140.

In some other embodiments of the present disclosure, a computer-readable storage medium is provided, at least one computer-readable instruction is stored thereon, when the at least one computer-readable instruction is executed by at least one processor, the processor is caused to execute operations of the method described above.

When the connection analysis method for the multi-port connected model and storage medium provided by the present disclosure are applied to the analysis of the application specific integrated circuit system, by acquiring the connection dictionary of the application specific integrated circuit system and retrieving the port connection status of the IP core instance or the module instance in the application specific integrated circuit system according to the search term, so as to facilitate the analysis of the application specific integrated circuit system. It is not necessary for the analyst to trace and obtain the connection status level by level according to the instance in the application specific integrated circuit system, which may save a lot of analysis time. During the automatic detection of the instance connection, the connection analysis method for the multi-port connected model and media of the present disclosure may quickly obtain the instance connection status and reduce the time consumption of the automatic detection.

It should be noted that in the claims, any reference symbol between brackets should not be constructed as a restriction on the claims. The word "including" does not exclude the existence of parts or steps not listed in the claims. The word "one" or "one" before a part does not exclude the existence of more than one such part. The present disclosure may be realized by means of hardware including several different components and by means of a properly programmed computer. In the unit claims that list several devices, several of these devices may be embodied by the same hardware item. The use of the first, second, and third words does not indicate any order. These words may be interpreted as names.

Although the preferred embodiments of the present disclosure have been described, those skilled in the art may make additional changes and modifications to these embodiments once they know the basic creative concepts. Therefore, the appended claims are intended to be interpreted as including preferred embodiments and all changes and modifications falling within the scope of the present disclosure.

Obviously, those skilled in the art may make various changes and variations to the disclosure without departing from the spirit and scope of the disclosure. In this way, when these modifications and variations of the present disclosure fall within the scope of the claims of the present disclosure and their equivalent technologies, the present disclosure is also intended to include these modifications and variations.

The invention claimed is:

1. A connection analysis method for a multi-port nested model, comprising:
    acquiring instance information and nested relationships of a multi-port nested model of an application specific integrated circuit and building an instance relationship tree;
    reading port information and connection information of instances, and adding the port information and the connection information to the instance relationship tree;
    acquiring the port information and the connection information of the instances of each node layer by layer according to the instance relationship tree to build a connection dictionary; and
    acquiring port-to-port connection information of the instances by retrieving the connection dictionary to perform connection analysis on the multi-port nested model.

2. The method according to claim 1, wherein the acquiring instance information and nested relationships of a multi-port nested model and building an instance relationship tree comprises:
    recording the instance information of the multi-port nested model and the nested relationships among the instances in a YAML file;
    adding root instances of the multi-port nested model in the YAML file to an instance queue to be processed;
    extracting instances in the instance queue to be processed by level as corresponding level nodes of the instance relationship tree;
    determining whether an extracted instance is nested with another instance; and
    in response to determining that the extracted instance is nested with another instance, adding a nested instance to a next level of the instance queue to be processed, and extracting level by level to build the instance relationship tree until the instance queue to be processed is empty.

3. The method according to claim 1, wherein the reading port information and connection information of instances, and adding the port information and the connection information to the instance relationship tree comprises:
    reading the port information of the instances to acquire ports of the instances, and adding the ports to the instances of the instance relationship tree;
    dividing ports in the port information into source ports and target ports, and acquiring a mapping relationship between the source ports and the target ports, to acquire the connection information; and
    connecting ports in the instance relationship tree according to the connection information.

4. The method according to claim 1, wherein when taking one port as a reference, the connection information is divided into two categories: a second connection from the one port to another port, and a first connection from another port to the one port.

5. The method according to claim 4, wherein the connection dictionary comprises keywords and connection descriptions corresponding to the keywords, the keywords are instance names of all instances in the instance relationship tree, the connection descriptions comprise the instances and the port information of the instances.

6. The method according to claim 5, wherein acquiring the port information and the connection information of the instances of each node layer by layer according to the instance relationship tree to build a connection dictionary comprises:
  traversing the instance names of all instances as the keywords;
  traversing the instances of nodes of the instance relationship tree layer by layer, and determining whether the first connection and the second connection exist on ports of the instances;
  in response to determining that only the second connection exist on one of the ports, tracing the instance and the port information of the instance along the second connection until arrived at one port without the second connection, recording traced contents in sequence to form the connection descriptions, and corresponding formed connection descriptions to the keywords formed by the instance names; and
  in response to determining that the second connection and the first connection exist on one of the ports, tracing the instance and the port information of the instance along the first connection until arrived at one port without the first connection, tracing the instance and the port information of the instance along the second connection until arrived at the port without the second connection, recording the traced contents as the connection descriptions, wherein the connection descriptions correspond to the keywords formed by the instance names of the instances where the port without the first connection is located.

7. The method according to claim 6, wherein the traversing the instances of nodes of the instance relationship tree layer by layer comprises:
  building a node queue, adding all instances of the nodes in the lowest layer of the instance relationship tree to the node queue;
  determining whether the node queue is empty;
  in response to the node queue being not empty, taking each instance of the node queue in sequence to process;
  in response to the node queue being empty, moving up one layer, adding all instances in the layer to the node queue until all instances of the nodes in the top-most layer are processed.

8. The method according to claim 5, wherein distinguishing symbols are set between different connection descriptions corresponding to a same keyword in the connection dictionary.

9. The method according to claim 5, wherein the keyword is regarded as a search term to retrieve in the connection dictionary and acquire the port-to-port connection information of the instances.

10. A computer-readable storage medium, wherein at least one computer-readable instruction is stored thereon, when the at least one computer-readable instruction is executed by at least one processor, the processor is caused to:
  acquire instance information and nested relationships of a multi-port nested model of an application specific integrated circuit and build an instance relationship tree;
  read port information and connection information of instances, and add the port information and the connection information to the instance relationship tree;
  acquire the port information and the connection information of the instances of each node layer by layer according to the instance relationship tree to build a connection dictionary; and
  acquire port-to-port connection information of the instances by retrieving the connection dictionary to perform connection analysis on the multi-port nested model.

11. The method according to claim 2, wherein before the operation of extracting instances in the instance queue to be processed by level as corresponding level nodes of the instance relationship tree, the method further comprises:
  determining whether the instance queue to be processed is empty.

12. The method according to claim 2, wherein the method further comprises:
  in response to determining that the extracted instance is not nested with another instance, determining whether the instance queue to be processed is empty; and
  in response to determining that the instance queue to be processed is not empty, extracting the instances level by level to build the instance relationship tree until the instance queue to be processed is empty.

13. The method according to claim 3, wherein the reading the port information of the instances comprises:
  acquiring the port information of the instances by scanning intellectual property (IP) instance files using programs.

14. The method according to claim 6, wherein traversing the instance names of all instances as the keywords comprises:
  traversing the instance names by using a YAML file.

15. The method according to claim 7, wherein after the operation of adding all instances in the layer to the node queue, the method further comprises:
  determining whether arriving at the top-most layer of the instance relationship tree;
  in response to arriving at the top-most layer, processing all instances of the nodes in the top-most layer and ending; and
  in response to not arriving at the top-most layer, determining whether the node queue is empty.

16. The computer-readable storage medium according to claim 10, wherein the acquire instance information and nested relationships of a multi-port nested model and build an instance relationship tree comprises:
  recording the instance information of the multi-port nested model and the nested relationships among the instances in a YAML file;
  adding root instances of the multi-port nested model in the YAML file to an instance queue to be processed;
  extracting instances in the instance queue to be processed by level as corresponding level nodes of the instance relationship tree;
  determining whether an extracted instance is nested with another instance; and
  in response to determining that the extracted instance is nested with another instance, adding a nested instance to a next level of the instance queue to be processed, and extracting level by level to build the instance relationship tree until the instance queue to be processed is empty.

17. The computer-readable storage medium according to claim 10, wherein the read port information and connection information of instances, and add the port information and the connection information to the instance relationship tree comprises:
  reading the port information of the instances to acquire ports of the instances, and adding the ports to the instances of the instance relationship tree;
  dividing ports in the port information into source ports and target ports, and acquiring a mapping relationship between the source ports and the target ports, to acquire the connection information; and
  connecting ports in the instance relationship tree according to the connection information.

18. The computer-readable storage medium according to claim 10, wherein when taking one port as a reference, the connection information is divided into two categories: a second connection from the one port to another port, and a first connection from another port to the one port.

19. The computer-readable storage medium according to claim 18, wherein the connection dictionary comprises keywords and connection descriptions corresponding to the keywords, the keywords are instance names of all instances in the instance relationship tree, the connection descriptions comprise the instances and the port information of the instances.

20. The computer-readable storage medium according to claim 19, wherein acquire the port information and the connection information of the instances of each node layer by layer according to the instance relationship tree to build a connection dictionary comprises:
  traversing the instance names of all instances as the keywords;
  traversing the instances of nodes of the instance relationship tree layer by layer, and determining whether the first connection and the second connection exist on ports of the instances;
  in response to determining that only the second connection exist on one of the ports, tracing the instance and the port information of the instance along the second connection until arrived at one port without the second connection, recording traced contents in sequence to form the connection descriptions, and corresponding formed connection descriptions to the keywords formed by the instance names; and
  in response to determining that the second connection and the first connection exist on one of the ports, tracing the instance and the port information of the instance along the first connection until arrived at one port without the first connection, tracing the instance and the port information of the instance along the second connection until arrived at the port without the second connection, recording the traced contents as the connection descriptions, wherein the connection descriptions correspond to the keywords formed by the instance names of the instances where the port without the first connection is located.

* * * * *

UNITED STATES PATENT AND TRADEMARK OFFICE
CERTIFICATE OF CORRECTION

| | | |
|---|---|---|
| PATENT NO. | : 11,829,696 B2 | Page 1 of 1 |
| APPLICATION NO. | : 18/022122 | |
| DATED | : November 28, 2023 | |
| INVENTOR(S) | : Peng Feng et al. | |

It is certified that error appears in the above-identified patent and that said Letters Patent is hereby corrected as shown below:

On the Title Page

Item (87) The PCT publication number should read WO2022/105461 and the PCT publication date should read May 27, 2022.

Signed and Sealed this
Ninth Day of January, 2024

*Katherine Kelly Vidal*

Katherine Kelly Vidal
*Director of the United States Patent and Trademark Office*